United States Patent [19]
Arakawa

[11] Patent Number: 4,791,614
[45] Date of Patent: Dec. 13, 1988

[54] SEMICONDUCTOR MEMORY DEVICE HAVING ERRONEOUS WRITE OPERATION PREVENTING FUNCTION

[75] Inventor: Hideki Arakawa, Yokohama, Japan

[73] Assignee: Fujitsu Limited, Kanagawa, Japan

[21] Appl. No.: 63,035

[22] Filed: Jun. 17, 1987

[30] Foreign Application Priority Data

Jun. 20, 1986 [JP] Japan .................................. 61-144322

[51] Int. Cl.$^4$ .............................................. G11C 7/00
[52] U.S. Cl. .................................... 365/228; 365/189; 365/218
[58] Field of Search ............... 365/226, 227, 228, 229, 365/189, 195, 218

[56] References Cited
U.S. PATENT DOCUMENTS 4,578,781   3/1986   Ogawa et al. ...................... 365/205

Primary Examiner—James W. Moffitt
Attorney, Agent, or Firm—Armstrong, Nikaido, Marmelstein & Kubovcik

[57] ABSTRACT

In a semiconductor memory device such as an E$^2$-PROM, a write enable signal (WE) is supplied to a buffer formed by an enhancement-type transistor ($Q_{11}$) and a depletion-type transistor ($Q_{12}$) having a node ($N_3$). The potential at this node is applied to a set terminal of a flip-flop (FF), and only when the potential at the node is higher than a trip point of the flip-flop, is the flip-flop set to generate an internal write enable signal (IWE) for an actual write operation.

5 Claims, 6 Drawing Sheets

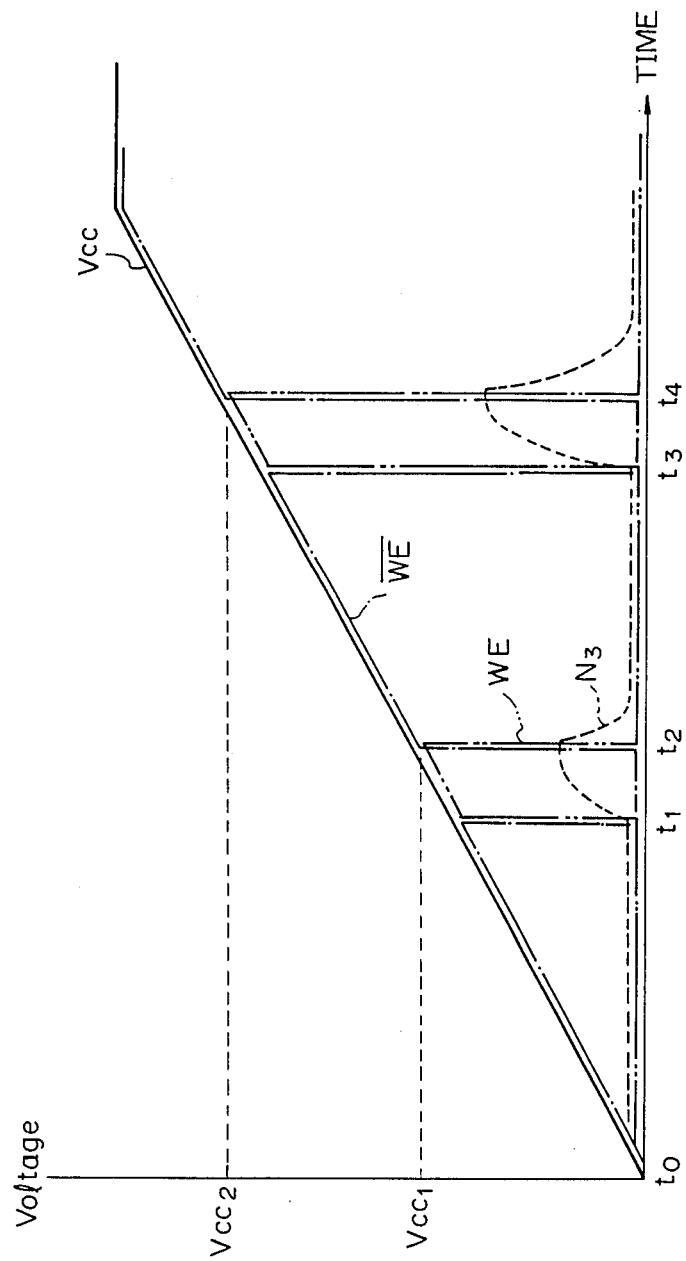

SEMICONDUCTOR MEMORY DEVICE HAVING ERRONEOUS WRITE OPERATION PREVENTING FUNCTION

BACKGROUND OF THE INVENTION

1. Field of the Invention

The present invention relates to the improvement of an erroneous write (or erase) operation preventing circuit in a semiconductor memory device such as an electrically erasable and programmable read-only memory (E²PROM), a nonvolatile random access memory (NOVRAM), and the like.

2. Description of the Related Art

In an E²PROM, NOVRAM, and the like, a write/erase voltage, which is remarkably higher than a normal power supply voltage $V_{CC}$ (for example, 5 V), is required. For this purpose, a step-up circuit has been incorporated into each chip to generate an internal write/erase voltage IVP such as 20 to 25 V. That is, a write/erase mode, a write enable signal is supplied to the step-up circuit, thereby increasing the write/erase voltage IVP. As a result, this high voltage IVP is applied to a memory cell to perform a write/erase operation thereupon due to a tunneling effect.

However, even when the power supply voltage $V_{CC}$ is not sufficiently high (for example, lower than 3.5 V), the step-up circuit and other circuits such as address buffers may be operated, thus erroneously carrying out a write/erase operation. That is, when the power supply voltage $V_{CC}$ rises or falls because the power supply thereof is turned ON or OFF, an erroneous write/erase operation may be carried out, thus destroying data stored in the cells. To avoid this, a $V_{CC}$ sense circuit is incorporated into each chip for detecting whether or not the power supply voltage $V_{CC}$ is higher than a predetermined value, and therefore, only when the power supply voltage $V_{CC}$ is higher than the predetermined value are the step-up circuit and the like operated. An erroneous write/erase operation preventing circuit is conventionally comprised of such a $V_{CC}$ sense circuit.

In prior art or proposed erroneous write/erase operation preventing circuits, however, the power consumption thereof is relatively large and the configuration thereof is relatively complex, as will be explained later.

SUMMARY OF THE INVENTION

An object of the present invention is to provide an erroneous write (or erase) operation preventing circuit, for a semiconductor memory device, having a low power consumption and simple configuration.

In an erroneous write/erase operation preventing circuit according to the present invention, a write enable signal WE is supplied to a buffer formed by an enhancement-type transistor and a depletion-type transistor having a node. The potential at this node is applied to a set terminal of a flip-flop. Only when the potential at the node is higher than a trip point of the flip-flop, is the flip-flop set to generate an internal write enable signal IWE for an actual write/erase operation.

In this circuit, the write enable signal WE can be a trigger signal, so that only a transient current flows through the buffer formed by the enhancement type transistor and the depletion transistor, thereby reducing the power consumption thereof. Also, the configuration is simple.

BRIEF DESCRIPTION OF THE DRAWINGS

The present invention will be more clearly understood from the description as set forth below with reference to the accompanying drawings, wherein:

FIG. 5 is a timing diagram showing the operation of the circuit of FIG. 4;

DESCRIPTION OF THE PREFERRED EMBODIMENT

Figure 1:
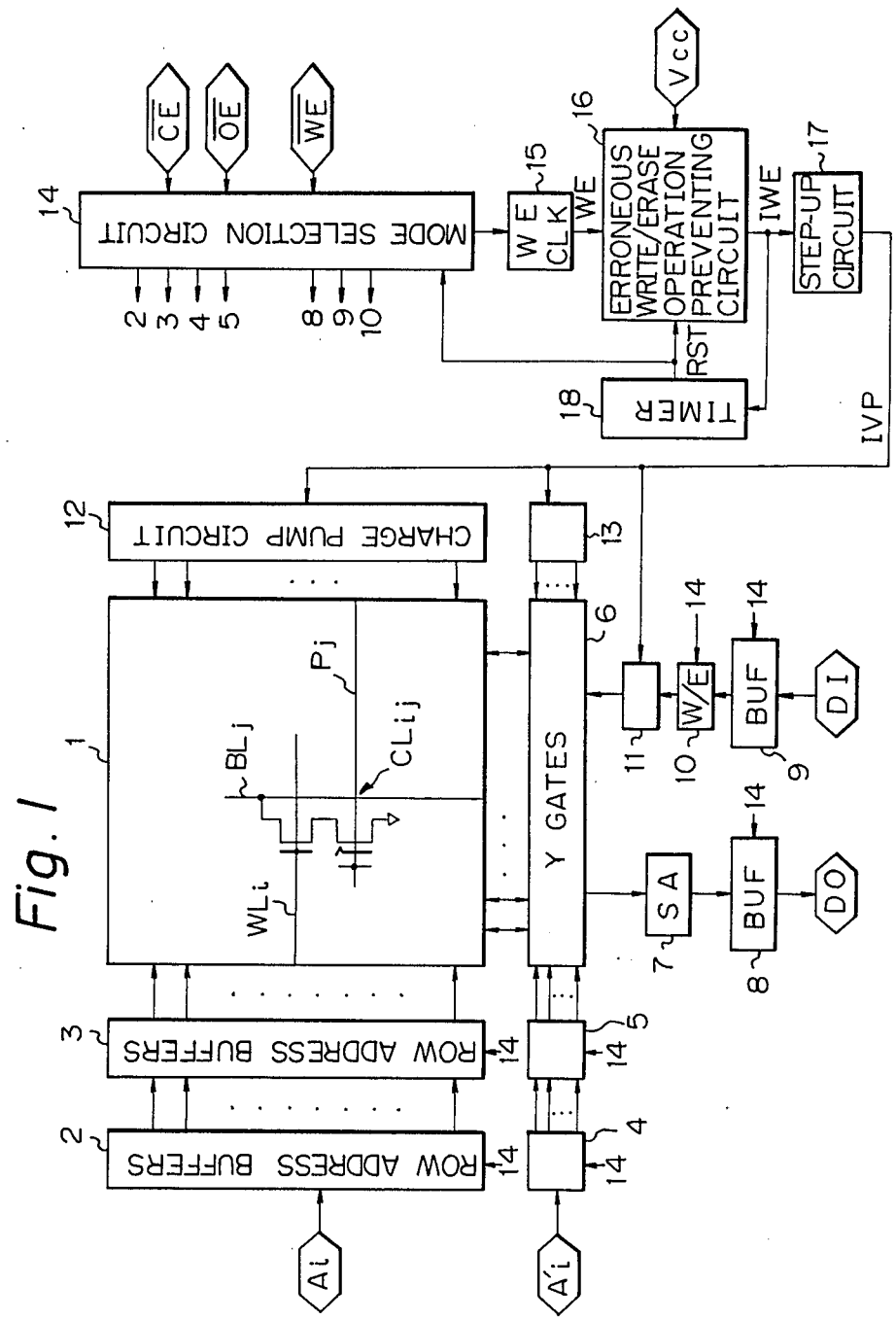
FIG. 1 is a block circuit diagram schematically illustrating all of an E²PROM to which the present invention applies.

First, an example of an E²PROM will be explained with reference to FIG. 1. In FIG. 1, reference numeral 1 designates a memory cell array including memory cells. For example, a memory cell $CL_{ij}$ is provided at an intersection between a word line $W_i$ and a bit line $BL_j$. $P_j$ designates a program line. Reference numeral 2 designates row address buffers each receiving an X-address signal $A_i$ (i=0 to n); 3 row address decoders; 4 column address buffers each for receiving a Y-address signal $A_i'$ (i=0 to n); 5 column address decoders; and 6 Y-gates. Output data is transmitted from the Y-gates 6 via a sense amplifier 7 and an output data buffer 8 to an output terminal DO, and input data is supplied from an input terminal DI via an input data buffer/latch circuit 9, a write/erase control circuit 10, and a charge pump circuit 11 to the Y-gates 6.

Reference numeral 14 designates a mode selection circuit for receiving a chip-enable signal $\overline{CE}$, a write-enable signal $\overline{WE}$, an output-enable signal $\overline{OE}$, and the like, to select an operation mode. That is, the mode selection circuit 14 controls the elements 2, 3, 4, 5, 8, 9, and 10, in accordance with the signal $\overline{CE}$, $\overline{WE}$, $\overline{OE}$, and the like.

Reference numeral 15 designates a clock generating circuit which generates a write enable clock signal WE when a write/erase operation is carried out.

Reference 16 designates an erroneous write/erase operation preventing circuit which receives the write enable clock signal WE and generates an internal write enable signal IWE for a step-up circuit 17. The step-up circuit generates a high voltage INV during a write/erase mode (IWE="1"). That is, the high voltage of the step-up circuit 17 is supplied to each of the charge pump circuits 11, 12, and 13.

Reference 18 designates a timer activated by the internal write enable signal IWE. That is, when a predetermined time period has passed after the generation of the internal write enable signal IWE, the timer 18 generates a reset signal RST to reset the mode selection circuit 14 and the erroneous write/erase operation preventing circuit 16.

A writing operation for the memory cell $CL_{ij}$ is carried out by applying a high voltage (20 V to 25 V) to the word line $WL_i$ and to the bit line $BL_j$. An erasing operation for the memory cell $CL_{ij}$ is carried out by applying a high voltage (20 V to 25 V) to the word line $WL_i$ and to the program line $P_j$. Note, generally, in an E²PROM, a "writing operation" denotes the writing of data "0" into a cell, and an "erasing operation" denotes the writing of data "1" into a cell. The read operation for the memory cell $C_{ij}$ is carried out by applying a power supply voltage $V_{CC}$ (=5 V) to the word line $WL_i$ and applying a predetermined bias voltage (about 2 V) to the program line $P_j$.

Figure 2:
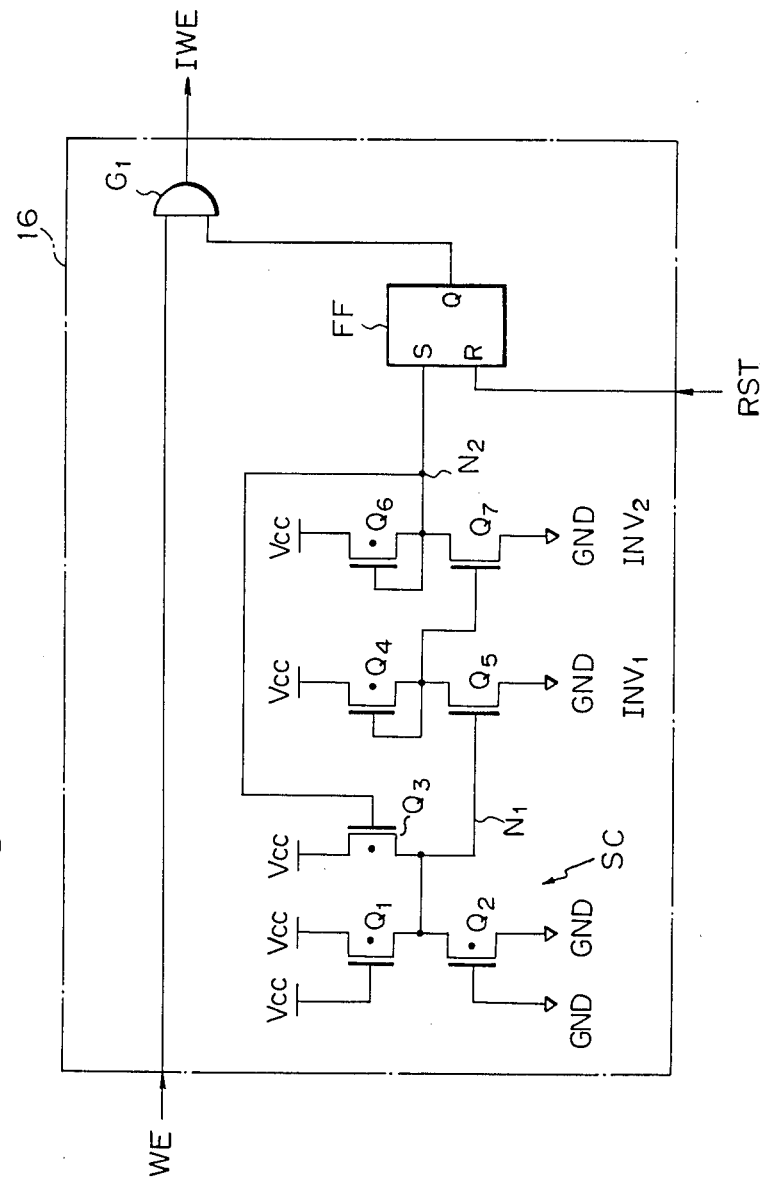
FIG. 2 is a circuit diagram of a proposed erroneous write/erase operation preventing circuit.

In FIG. 2, which illustrates a proposed erroneous write/erase operation preventing circuit, this circuit is comprised of a $V_{CC}$ sense circuit SC, a flip-flop FF, and an AND circuit $G_1$. The $V_{CC}$ sense circuit SC is comprised of depletion-type transistors $Q_1$ and $Q_2$ forming a voltage divider, a depletion-type transistor $Q_3$ serving as a feedback means, a depletion-type transistor $Q_4$ and an enhancement-type transistor $Q_5$ forming an inverter $INV_1$, and a depletion-type transistor $Q_6$ and an enhancement-type transistor $Q_7$ forming an inverter $INV_2$.

In the circuit of FIG. 2, since the transistor $Q_2$ is always conductive to pull down the potential at node $N_1$ to the ground GND, the potential at node $N_1$ is 0 V when the power supply voltage $V_{CC}$ is 0 V. Next, when a power supply is turned ON to raise the power supply voltage $V_{CC}$, a current flowing through the transistors $Q_1$ and $Q_2$ increases so that the potential at node $N_1$ is increased in accordance with the conductance ratio of the transistor $Q_1$ to the transistor $Q_2$. As a result, when the potential at node $N_1$ exceeds a trip point of the inverter $INV_1$, the inverters $INV_1$ and $INV_2$ are operated to increase the potential at node $N_2$, which is fed back to the gate of the transistor $Q_3$. Therefore, the potential at node $N_1$ is rapidly increased, and accordingly, the potential at node $N_2$ is also rapidly increased. As a result, the flip-flop FF is set to generate an internal write enable signal IWE via the AND circuit $G_1$. In this case, the transistor $Q_3$ remains in a conductive state, so that the potential at node $N_1$ is stable and holds the operation of the inverters $INV_1$ and $INV_2$. Conversely, when the power supply is turned OFF, the power supply voltage $V_{CC}$ is decreased. As a result, when the potential at node $N_1$ becomes lower than the trip point of the inverter $INV_1$, the potential at node $N_2$ is decreased.

Therefore, in the circuit of FIG. 2, when the trip point of the inverter $INV_1$ is designed to meet the case wherein the power supply voltage $V_{CC}$ is a predetermined value such as 3.5 V, the circuit of FIG. 2 exhibits an excellent $V_{CC}$ sense circuit function.

In the circuit of FIG. 2, since the initial stage such as $Q_1$ to $Q_3$ is comprised of depletion-type transistors which are resistant to noise, it is not affected by the fluctuation of each element. In the circuit of FIG. 2, however, since the inverter $INV_1$ is operated only when a difference between the potential at node $N_1$ and the power supply voltage reaches a constant value, the above-mentioned voltage divider is necessary for effectively operating the inverter $INV_1$. Therefore, when the power supply is being turned ON, a current always flows through the voltage divider ($Q_1$ and $Q_2$), thus raising a problem of a large power consumption. Also, in this case, a current flows through at least one of the inverters $INV_1$ and $INV_2$, thus also raising a problem of a large power consumption.

Figure 3:
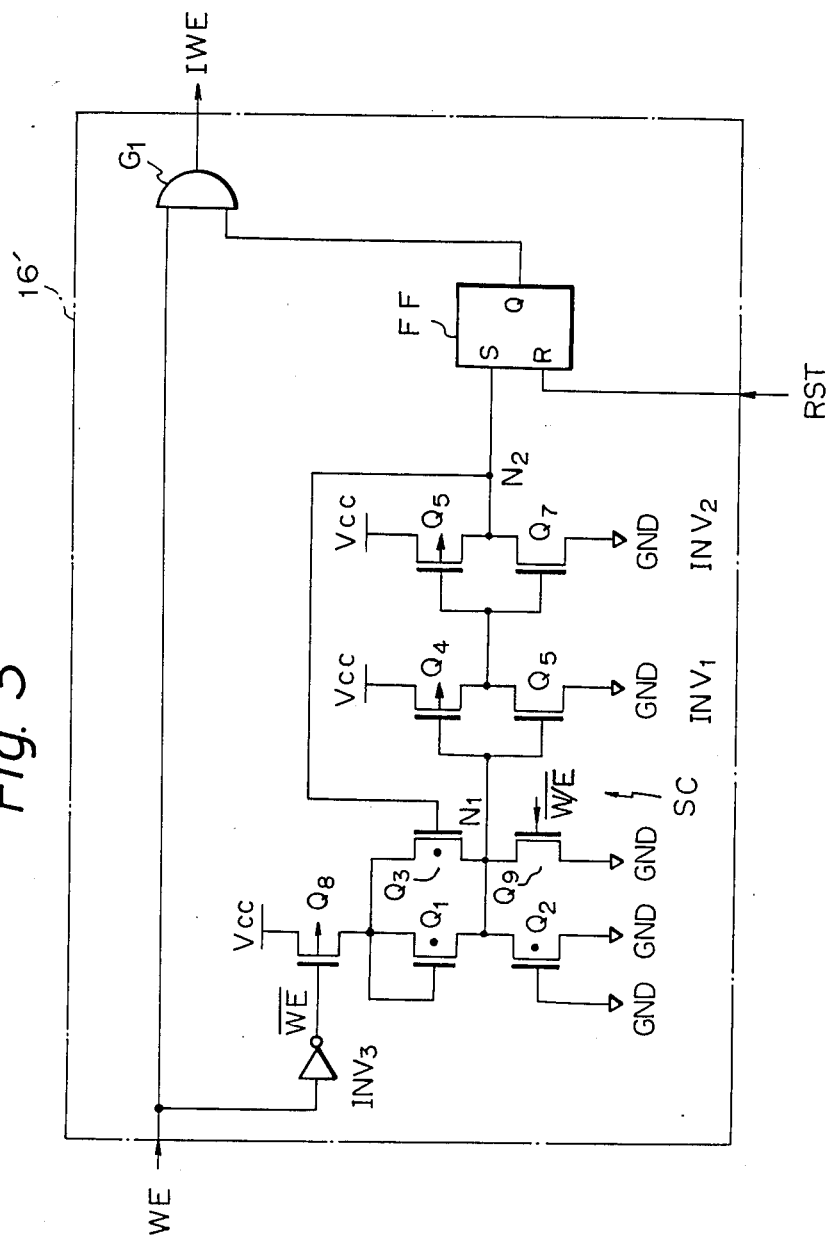
FIG. 3 is a circuit diagram of another proposed erroneous write/erase operation preventing circuit.

In FIG. 3, which illustrates another proposed erroneous write/erase operation preventing circuit which solves the power consumption problems in the circuit of FIG. 2, a complementary MOS (CMOS) inverter $INV_3$, a P-channel MOS transistor $Q_8$, and an N-channel MOS transistor $Q_9$ are added to the elements of FIG. 2, and the inverters $INV_1$ and $INV_2$ are also CMOS type. An inverted signal $\overline{WE}$ of the write enable signal WE is applied to the gates of the transistors $Q_8$ and $Q_9$, as a result, even after the power supply is turned ON, if the signal $\overline{WE}$ is at a high level (non write/erase mode), the transistor $Q_8$ is turned OFF while the transistor $Q_9$ is turned ON. As a result, no current flows through the $V_{CC}$ sense circuit SC. That is, only when the signal $\overline{WE}$ is at a low level (write/erase mode), is the $V_{CC}$ sense circuit SC operated.

Further, in the circuit of FIG. 3, since the $V_{CC}$ sense circuit SC is controlled by the power supply voltage $V_{CC}$ and the inverted signal $\overline{WE}$ of the write enable signal WE, the configuration and operation thereof are complex. Furthermore, in the circuit of FIG. 3 as well as the circuit of FIG. 2, a hysteresis phenomenon occurs when the power supply is turned ON and OFF. It is, however, impossible to avoid this hysteresis phenomenon, since the potential at node $N_2$ is fed back to the base of the transistor $Q_3$. In order to reduce the hysteresis phenomenon, the size of the feedback transistor $Q_3$ may be reduced. In this case, however, since the rise time of the power supply is on the order of milliseconds while the operation speed of the inverters is on the order of nanoseconds, the $V_{CC}$ sense circuit SC may be oscillated when the power supply voltage $V_{CC}$ rises, thus inviting a malfunction in the operation of the internal circuits.

Figure 4:
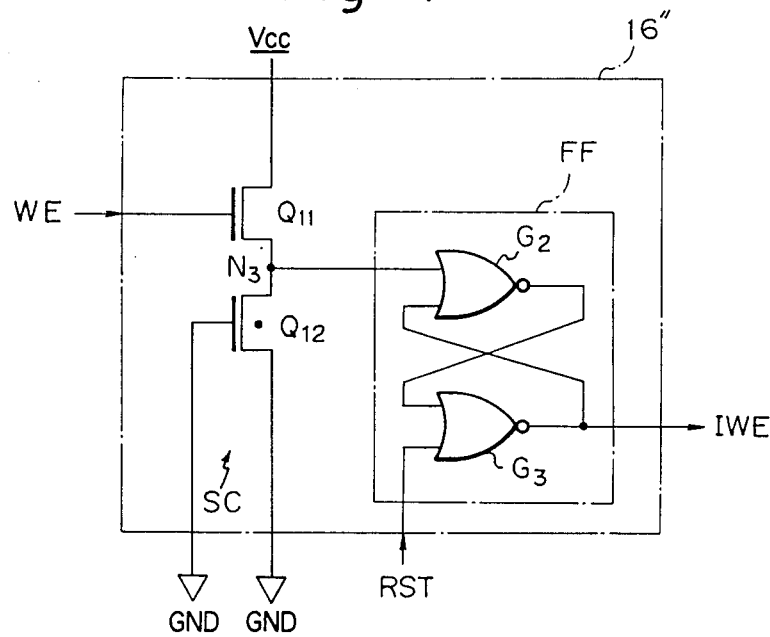
FIG. 4 is a circuit diagram of an embodiment of the erroneous write/erase operation preventing circuit according to the present invention.

In FIG. 4, which illustrates an embodiment of the erroneous write/erase operation preventing circuit according to the present invention, an N-channel enhancement-type transistor $Q_{11}$ and an N-channel depletion-type transistor $Q_{12}$ are connected in series between the power supply terminals labelled $V_{CC}$ and GND, to form the $V_{CC}$ sense circuit SC. That is, the transistor $Q_{11}$ has a drain connected to the power supply $V_{CC}$, a gate for receiving a write enable signal WE, and a source connected to a node $N_3$. Also, the transistor $Q_{12}$ has a drain connected to the node $N_3$, and a gate connected to a source thereof, which is also connected to the power supply GND.

Connected to the node $N_3$ is a flip-flop FF formed by two cross-coupled NOR circuits $G_2$ and $G_3$. In this case, the NOR circuits $G_2$ and $G_3$ are comprised of well known CMOS transistors.

The operation of the circuit of FIG. 4 will be explained with reference to FIGS. 5 and 6. When the power supply voltage $V_{CC}$ rises from time $t_0$, the write enable signal WE and the inverted signal $\overline{WE}$ thereof also rise, however, these signals cannot exceed the power supply voltage $V_{CC}$, since they are internal signals.

Figure 6:
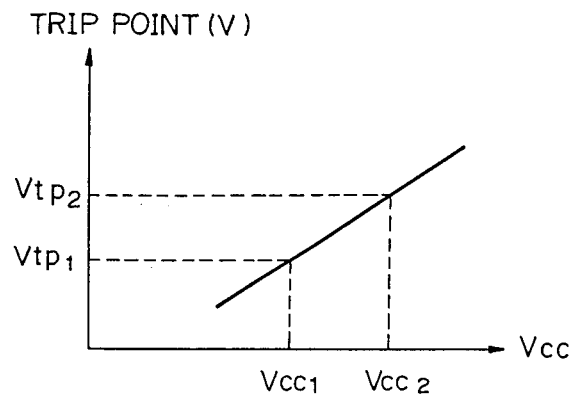
FIG. 6 is a graph showing the trip point characteristics of the flip-flop of FIG. 4; and, FIG. 7 is a circuit diagram of a trigger circuit interposed into the circuit of FIG. 1.

At time $t_1$, when the write enable signal WE rises due to noise or the like to turn ON the transistor $Q_{11}$, the potential at node $N_3$ also rises, but in this case, this potential cannot exceed a trip point $V_{tp1}$ of the flip-flop FF which is dependent upon the power supply voltage $V_{CC}$ (=$V_{CC1}$) at time $t_2$, as shown in FIG. 6.

Contrary to above, at time $t_3$, when the write enable signal WE rises to turn ON the transistor $Q_{11}$, the potential at node $N_3$ rises, and in this case, this potential exceeds a trip point $V_{tp2}$ of the flip-flop FF where $V_{CC}$ equals $V_{CC2}$, as shown in FIG. 6.

Thus, if the trip point characteristics of the CMOS flip-flop FF are suitably adjusted, the flip-flop FF is not set before the power supply voltage $V_{CC}$ reaches a level which is, for example, between the two levels $V_{CC1}$ and $V_{CC2}$. Therefore, an erroneous write/erase operation due to noise can be avoided when the power supply voltage $V_{CC}$ is relatively low.

Once the potential at node $N_3$ reaches the abovementioned level for 5 to 6 nanoseconds, the flip-flop FF can not be inverted by any kind of noise. Also, in the circuit of FIG. 4, the hysteresis phenomenon does not occur when the power supply is turned ON and OFF.

Figure 7:
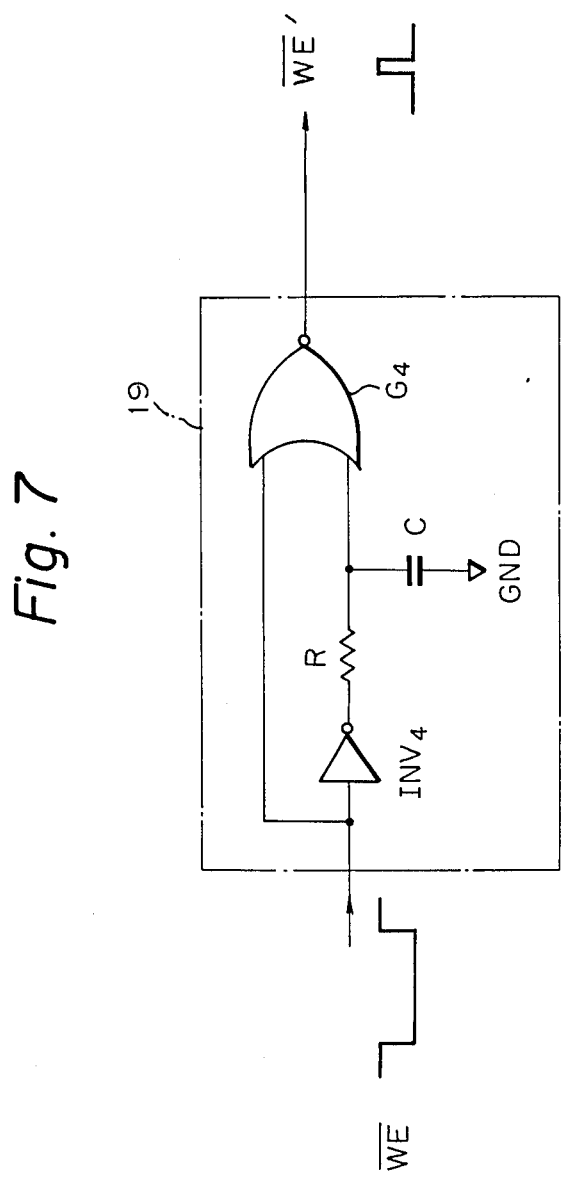

Further, if a trigger pulse WE' is used instead of the write enable signal WE, current flows through the $V_{CC}$ sense circuit SC for only a very short time period, thus further reducing the power consumption. Note that such a trigger pulse WE' can be generated by a trigger circuit 19 as shown in FIG. 7. In FIG. 7, $INV_4$ designates a CMOS inverter, R a resistor, C a capacitor, and $G_4$ a CMOS NOR circuit.

As explained above, the erroneous write/erase operation preventing circuit of the present invention has an advantage over the proposed circuits, in that the configuration is simple; the hysteresis phenomenon does not occur when the power supply is turned ON and OFF; and, the circuit does not operate before the power supply voltage $V_{CC}$ reaches a predetermined voltage, so that the operation of the circuit is not affected by noise. Further, since the control signal of the current cut-off transistor $Q_{11}$ can be a trigger pulse, only a transient current flows through the transistors of the $V_{CC}$ sense circuit, and thus it is possible to realize a very low power dissipation circuit.

I claim:

1. A semiconductor memory device comprising:
  a first power supply terminal means ($V_{CC}$);
  a second power supply terminal means (GND);
  a terminal for receiving a write enable signal (WE);
  an erroneous write operation preventing circuit (16"), connected to said first and second power supply terminal means and to said terminal, for receiving said write enable signal and generating an internal write enable signal (IWE) for an actual write operation only when a potential of said high power supply terminal means is higher than a predetermined value; and
  means, connected to said erroneous write operation preventing circuit, for resetting said circuit after receiving said internal write enable signal,
  said erroneous write operation preventing circuit comprising:
    an enhancement-type MIS transistor ($Q_{11}$) having a drain connected to said first power supply terminal means, a gate for receiving said write enable signal, and a source;
    a depletion-type MIS transistor ($Q_{12}$) having a drain connected to the source of said enhancement-type MIS transistor, and a gate and a source thereof connected to said second power supply terminal means; and
    a flip-flop (FF) having a set terminal connected to the drain of said depletion-type MIS transistor, a reset terminal for receiving an output signal from said resetting means, and an output for generating said internal write enable signal.

2. A device as set forth in claim 1, wherein said flip-flop comprises cross-coupled CMIS NOR circuits ($G_2$, $G_3$).

3. A device as set forth in claim 1, further comprising a trigger circuit connected between said terminal for receiving the write enable signal (WE) and said erroneous write operation preventing circuit.

4. A device as set forth in claim 1, further comprising a write enable signal generating circuit (14, 15), connected to said terminal, for generating said write enable signal.

5. A device as set forth in claim 1, wherein said resetting means comprises a timer (18) for resetting said write operation preventing circuit when a predetermined time period after receiving said internal write enable signal.

* * * * *